(12) United States Patent
Haga et al.

(10) Patent No.: US 10,527,935 B2
(45) Date of Patent: Jan. 7, 2020

(54) RADIATION-SENSITIVE COMPOSITIONS AND PATTERNING AND METALLIZATION PROCESSES

(71) Applicant: Rohm and Haas Electronic Materials LLC, Marlborough, MA (US)

(72) Inventors: Mitsuru Haga, Minamikanbara-gun (JP); Shugaku Kushida, Niigata (JP); Kunio Kainuma, Shibata (JP); James F. Cameron, Brookline, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/848,006

(22) Filed: Dec. 20, 2017

(65) Prior Publication Data

US 2018/0188648 A1    Jul. 5, 2018

Related U.S. Application Data

(60) Provisional application No. 62/441,336, filed on Dec. 31, 2016.

(51) Int. Cl.
| | | |
|---|---|---|
| *G03F 7/40* | (2006.01) | |
| *G03F 7/004* | (2006.01) | |
| *H01L 21/3205* | (2006.01) | |
| *G03F 7/039* | (2006.01) | |
| *G03F 7/20* | (2006.01) | |
| *C23C 18/16* | (2006.01) | |
| *C23C 18/18* | (2006.01) | |
| *C23C 18/38* | (2006.01) | |
| *G03F 7/00* | (2006.01) | |
| *G03F 7/32* | (2006.01) | |

(52) U.S. Cl.
CPC ........ *G03F 7/0045* (2013.01); *C23C 18/1612* (2013.01); *C23C 18/1667* (2013.01); *C23C 18/1689* (2013.01); *C23C 18/1844* (2013.01); *C23C 18/38* (2013.01); *G03F 7/0035* (2013.01); *G03F 7/0046* (2013.01); *G03F 7/039* (2013.01); *G03F 7/0392* (2013.01); *G03F 7/0397* (2013.01); *G03F 7/2002* (2013.01); *G03F 7/2004* (2013.01); *G03F 7/2006* (2013.01); *G03F 7/322* (2013.01); *G03F 7/40* (2013.01); *H01L 21/32056* (2013.01)

(58) Field of Classification Search
CPC ........ G03F 7/20; G03F 7/2004; G03F 7/2006; G03F 7/0045; G03F 7/2002; G03F 7/40; H01L 21/32056
USPC ...................................................... 430/324
See application file for complete search history.

(56) References Cited

U.S. PATENT DOCUMENTS

| 5,658,706 A * | 8/1997 | Niki ...................... G03F 7/0045 430/176 |
| 6,787,287 B2 * | 9/2004 | Kim ....................... G03F 7/0758 430/270.1 |
| 8,846,301 B2 | 9/2014 | Ober et al. |
| 2006/0166132 A1 | 7/2006 | Meagley |
| 2007/0275320 A1 | 11/2007 | Washio et al. |
| 2008/0085458 A1* | 4/2008 | Yamato ................. C07C 309/65 430/7 |
| 2011/0021479 A1* | 1/2011 | Stadlwieser ......... C07D 487/04 514/171 |
| 2015/0064620 A1* | 3/2015 | Kaur ..................... G03F 7/0046 430/270.1 |
| 2015/0208501 A1* | 7/2015 | Hayashi ................... G03F 7/20 174/251 |
| 2015/0241776 A1 | 8/2015 | Chien et al. |
| 2015/0355543 A1 | 12/2015 | Takemura et al. |
| 2016/0291464 A1 | 10/2016 | Kawamura et al. |

OTHER PUBLICATIONS

Search report for corresponding Europe Application No. 17 21 1251 dated Apr. 30, 2018.
Search report for corresponding Taiwan Application No. 106146323 dated Dec. 21, 2018.

* cited by examiner

Primary Examiner — John S Chu
(74) Attorney, Agent, or Firm — Jonathan D. Baskin (57) ABSTRACT

A patterning process, comprises: (i) forming a radiation-sensitive film on a substrate, wherein the radiation-sensitive film comprises: (a) a resin, (b) a photoacid generator, (c) a first quencher, and (d) a second quencher; (ii) patternwise exposing the radiation-sensitive film to activating radiation; and (iii) contacting the radiation-sensitive film with an alkaline developing solution to form a resist pattern; wherein the resin comprises the following repeat units:

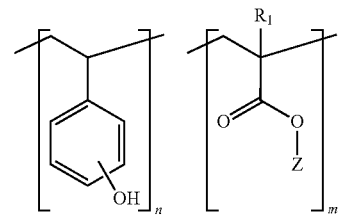

wherein: $R_1$ is selected from a hydrogen atom, an alkyl group having from 1 to 4 carbon atoms, a cyano group or a trifluoromethyl group; Z is a non-hydrogen substituent that provides an acid-labile moiety; n is from 40 to 90 mol %; m is from 10 to 60 mol %; and the total combined content of the two repeat units in the resin is 80 mol % or more based on all repeat units of the resin; and the first quencher is selected from benzotriazole or a derivative thereof.

11 Claims, 4 Drawing Sheets

RADIATION-SENSITIVE COMPOSITIONS AND PATTERNING AND METALLIZATION PROCESSES

FIELD

The present invention relates generally to patterning and metallization processes, and to radiation-sensitive compositions useful in such processes. More specifically, the processes and compositions are useful in depositing a metal on a substrate, for example, for forming micro metal bumps on a metal layer. The invention finds particular use in the semiconductor manufacturing industry, for example, in semiconductor device and MEMs manufacturing, and in packaging applications such as in the formation of metal bumps for use in package on package, chip on chip or flip chip bonding of microprocessor or memory devices.

INTRODUCTION

Mobile, internet of things (IoT) and wearable electronics require increasingly smaller, lighter and thinner devices. Micro-processors and memory used in these devices also have similar demands. The manufacture and packaging of these electronic devices serves an important role in the size reduction requirement. For example, flip-chip packaging methods have been used to increase the density of I/O (Input/Output) connection between devices, especially for MPU and DRAM semiconductor chips.

As a method of chip-to-chip connection, metal pillar bumps such as copper pillar bumps have been investigated to take advantage of beneficial connection resistance, high-density connection, metal migration resistance, and thermal dissipation properties, as compared with solder bumps. As a fabrication method of copper pillar bump arrays, electroplating has been used. DFR (Dry Film Resist) is attached on a thin sputtered copper film surface, and a mask pattern having a contact-hole array is made by photolithography. Pillars are then formed in the contact-hole pattern on the copper surface by electroplating. The photoresist is removed, and the thin sputtered copper layer that was previously covered by the resist is removed by etching. i-line (365 nm) or broad band lithography has typically been used to image plating mask patterns.

Another approach to the preparation of plating mask patterns is the use of thick photoresist layers to respond to requirements of thicker and narrower pillar size for further increases in I/O density. Chemically amplified photoresists may be a suitable option for achieving the faster sensitivity and improved transparency desired for higher resolution patterns. Such resist compositions typically include a polymer having acid labile groups, a photoacid generator (PAG), and a solvent. However, when chemically amplified resists are formed on a metal layer, such as a copper layer, footing profile issues have been observed. The inventors believe that such footing profile issues are a result of photoacid present at the interface between the metal surface and resist.

Resist compositions comprising benzotriazole (BTA), benzimidazole and triazole to prevent footing issue are known (see JP2004198944A, WO2006059392A and JP2001249451A). However, there remains a need for new methods and resist compositions which can provide a micro mask pattern on a metallic layer.

SUMMARY OF THE INVENTION

In accordance with a first aspect of the invention, patterning processes are provided. The processes comprise: (i) forming a radiation-sensitive film on a substrate, wherein the radiation-sensitive film comprises: (a) a resin, (b) a photoacid generator, (c) a first quencher, and (d) a second quencher; (ii) patternwise exposing the radiation-sensitive film to activating radiation; and (iii) contacting the radiation-sensitive film with an alkaline developing solution to form a resist pattern; wherein the resin comprises the following repeat units:

wherein: $R_1$ is selected from a hydrogen atom, an alkyl group having from 1 to 4 carbon atoms, a cyano group or a trifluoromethyl group; Z is a non-hydrogen substituent that provides an acid-labile moiety; n is from 40 to 90 mol %; m is from 10 to 60 mol %; and the total combined content of the two repeat units in the resin is 80 mol % or more based on all repeat units of the resin; and the first quencher is selected from benzotriazole or a derivative thereof.

In accordance with a further aspect of the invention, processes for depositing a metal on a metal layer are provided. The processes comprise the steps of: (i) forming a radiation-sensitive film on a metal layer, wherein the film comprises: (a) a resin, (b) a photoacid generator, (c) a first quencher, and (d) a second quencher; (ii) patternwise exposing the radiation-sensitive film to activating radiation; and (iii) contacting the radiation-sensitive film with an alkaline developing solution to remove exposed portions of the radiation-sensitive film; and (iv) immersing the metal layer in a metal plating solution and depositing a metal on the metal layer in the exposed portions of the radiation-sensitive film; wherein the resin comprises the following two repeat units:

wherein: $R_1$ is selected from a hydrogen atom, an alkyl group having from 1 to 4 carbon atoms, a cyano group or a trifluoromethyl group; Z is a non-hydrogen substituent that provides an acid-labile moiety; n is from 40 to 90 mol %; m is from 10 to 60 mol %; and the total combined content of the two repeat units in the resin is 80 mol % or more based on all repeat units of the resin; and the first quencher is selected from benzotriazole or a derivative thereof.

In accordance with a further aspect of the invention, radiation-sensitive compositions are provided. The compositions comprise: (a) a resin; (b) two or more photoacid generators; (c) a first quencher; (d) a second quencher; and (e) a solvent; wherein the resin comprises the following two repeat units:

wherein: $R_1$ is selected from a hydrogen atom, an alkyl group having from 1 to 4 carbon atoms, a cyano group or a trifluoromethyl group; Z is a non-hydrogen substituent that provides an acid-labile moiety; n is from 40 to 90 mol %; m is from 10 to 60 mol %; and the total combined content of the two repeat units in the resin is 80 mol % or more based on all repeat units of the resin; wherein the photoacid generators are selected from N-hydroxynaphthalimide trifluoromethanesulfonate, N-hydroxynaphthalimide perfluoro-1-butanesulfonate, N-hydroxynaphthalimide camphor-10-sulfonate, N-hydroxynaphthalimide 2-trifluoromethylphenylsulfonate, N-hydroxy-5-norbornene-2,3-dicarboximide perfluoro-1-butanesulfonate, N-(trifluoromethylsulfonyloxy)phthalimide and N-hydroxysuccinimide perfluorobutanesulfonate; wherein the first quencher is selected from benzotriazole or its derivatives; wherein the second quencher is selected from N,N-diethyldodecanamide, 2,8-dimethyl-6H,12H-5,11-methanodibenzo[b,f][1,5]diazocine,1,1-dimethylethyl 4-hydroxypiperidine-1-carboxylate and N-allylcaprolactam; and wherein the solid content of the composition is from 10 to 60 weight %.

DETAILED DESCRIPTION OF THE INVENTION

The present invention uses a radiation-sensitive film comprising (a) a resin, (b) a photoacid generator, (c) a first quencher and (d) a second quencher. The radiation-sensitive film is formed from a composition comprising (a) a resin, (b) a photoacid generator, (c) a first quencher, (d) a second quencher and (e) a solvent.
(a) Resin
The resin of the composition comprises the following two units:

In the formula, $R_1$ is selected from a hydrogen atom, a methyl group, a cyano group (—CN) or trifluoromethyl (—CF3) group. Preferably, $R_1$ is selected from a hydrogen atom or a methyl group. Z is a non-hydrogen substituent that provides an acid-labile moiety. Examples of such non-hydrogen substituent that provides an acid-labile moiety include, but are not limited to, tert-butyl, ethylcyclopentyl, ethylcyclohexyl, 2-methyladamantyl, 2-ethyladamantyl and 2-isopropyl-2-adamantyl. n is from 40 to 90 mol %; m is from 10 to 60 mol %; and the total combined content of the two repeat units in the resin is 80 mol % or more based on all repeat units of the resin.

The resin comprise at least two different unit types: (i) a hydroxy styrene unit, and (ii) an acrylate unit which has a non-hydrogen substituent that provides an acid-labile moiety. The resin can be synthesized from a monomer mixture comprising hydroxy styrene and acrylate which has a non-hydrogen substituent that provides an acid-labile moiety. Examples for the acrylate which has a non-hydrogen substituent that provides an acid-labile moiety include, but are not limited to the following:

wherein $R_1$ is as defined above.

The total amount of the two units in the resin is 80 mol % or more, preferably 85 mol % or more, and further more preferably 90 mol % or more, based on total repeat units of the resin. The most preferred resin consists of a 4-hydroxy styrene repeat unit and an acrylate repeat unit which has a non-hydrogen substituent that provides an acid-labile moiety. The 4-hydroxy styrene unit contributes to increased solubility of the resin in alkaline solution as compared with conventionally used cresol-novolac resins, due to the higher alkaline dissolution rate of polyhydroxy styrene. The non-hydrogen substituent that provides an acid-labile moiety of the acrylic ester is removed by acid catalyzed deprotection to generate a carboxyl functional unit which provides enhanced solubility of the resin in alkaline solution, thereby allowing for pattern developement.

The resin can comprise a third unit in addition to the hydroxy styrene unit and the acrylate unit which has a non-hydrogen substituent that provides an acid-labile moiety. A monomer which provides the third unit (i.e., third monomer) can be included in the monomer mixture. Examples of such third monomer include, but are not limited to: styrene, branched or normal alkyl (meth)acrylates such as ethyl acrylate, propyl acrylate or isobutyl acrylate; branched or normal hydroxyl alkyl acrylates such as 2-hydroxy ethyl acrylate, 3-hydroxy propyl acrylate or 2-hydroxy propyl acrylate; and alkyl ether acrylates such as methoxy ethyl acrylate or ethoxy ethyl acrylate. Further, one or more additional resins as described above and/or different resins can be used in the photoresist compositions of the invention.

The resin has a weight average molecular weight (Mw) of from 8,000 to 50,000 Daltons, preferably from 10,000 to 30,000 Daltons, as measured by GPC with Styrene polymer standard.

The content of the polymer in the composition is typically from 70 to 99 wt %, preferably from 80 to 98 wt %, based on total solids of the composition. The content of the polymer in the composition is typically from 10 to 60 wt %, preferably from 30 to 50 wt %, based on the total composition.

(b) Photoacid generator (PAG)

The photoresist compositions of the invention include one or more photoacid generators (PAGs). The PAGs should absorb energy at the exposure wavelength, for example, from 200 to 500 nm, typically 365 nm (i-line) wavelength.

The photoacid generator is preferably selected from the sulfonimide-type PAGs. Sulfonimide-type PAG means a PAG which has a sulfonimide structure in the molecule. Preferably, a plurality of sulfonimide-type PAGs are used, and typically two. Examples of such sulfonimide-type PAGs include, but are not limited to, N-Hydroxynaphthalimide trifluoromethanesulfonate, N-Hydroxynaphthalimide perfluoro-1-butanesulfonate, N-Hydroxynaphthalimide camphor-10-sulfonate, N-Hydroxynaphthalimide 2-trifluoromethylphenylsulfonate, N-Hydroxy-5-norbornene-2,3-dicarboximide perfluoro-1-butanesulfonate, N-(Trifluoromethylsulfonyloxy)phthalimide and N-Hydroxysuccinimide perfluorobutanesulfonate. The combination of N-Hydroxynaphthalimide trifluoromethanesulfonate and N-Hydroxynaphthalimide perfluoro-1-butanesulfonate are particularly preferred.

The inventors have found that nitrile-containing oxime-type photoacid generators may not be useful for certain aspects of the present invention. For example, the inventors have found that nitrile-containing oxime-type photoacid generators can gives rise to a popping problem on copper surfaces after spin-coat and pre-bake processes, whereas such problem may not be present when coating the composition on other substrate types such as on silicon surfaces. Accordingly, the compositions of the present invention can optionally be free of nitrile-containing PAGs.

The amount of the PAG in the radiation-sensitive film is preferably from 0.01 to 10 wt %, more preferably from 0.2 to 2.0 wt %, based on the weight of the resin (a).

(c) First quencher

The first quencher is effective to reduce footing profile issues at the bottom of contact-hole patterns on a metal layer. When a radiation-sensitive (photoresist) film is formed on a metal layer such as a copper or copper alloy layer, the photosensitivity of the film can be reduced in the region of its interface with the metal layer. It is believed that this reduction in photosensitivity results from consumption of generated photoacid by metal ions formed at the resist film/metal layer interface in an electrochemical reaction (see Griffin et al, *A Simple Phase Transition Model for Metal Passivation Kinetics*, J. Electrochem. Soc., vol. 131, No. 1, pages 18-21). This is believed to result in a low concentration of photoacid at the interface. As a consequence, acid-catalyzed cleavage of the acid-labile moiety on the acrylate unit of the resin would be less efficient at the resist/copper interface and footing would result. The first quencher is believed to be effective to inhibit formation of metal ions at the resist film/metal layer interface.

The first quencher is selected from benzotriazole or its derivatives. Examples of benzotriazole derivatives include, but are not limited to, 1H-benzotiazole-1-methanol, 1-aminobenzotriazole, 1-(formamidomethyl)-1H-benzotriazole, 1-(methoxymethyl)-1H-benzotriazole, 2-(2-hydroxy-5-methylphenyl)benzotriazole, 2-(2-hydroxy-5-tert-ocrylphenyl)benzotriazole, 5-methyl-1H-benzoriazole, 5,6-methyl-1H-benzotriazole and 5,6-dimethyl-1,2,3-benzotriazole hydrate. Preferably, benzotriazole, 1H-benzotiazole-1-methanol, 5-methyl-1H-benzoriazole or 5,6-dimethyl-1,2,3-benzotriazole hydrate can be used for the invention. The inventors have found that benzotriazole or derivatives thereof can prevent the formation of metal ions such as copper ions, without decreasing sensitivity of the radiation-sensitive film.

The amount of the first quencher in the radiation-sensitive film is preferably from 0.001 to 1.0 wt %, more preferably from 0.005 to 0.2 wt %, and most preferably from 0.01 to 0.1 wt %, based on the weight of the resin (a).

(d) Second quencher

The second quencher is believed to be work as an acid diffusion control in the middle or upper surface regions of the radiation-sensitive film to compensate for the relatively high volatility of the benzotriazole analogues. When the radiation-sensitive film is formed without use of the second quencher, the contact hole sidewalls can have a tapered profile. Straight and perpendiclar sidewalls are highly favorable in metal pillar bump formation. The second quencher is selected from amine compounds with exception of normal and branched tertiary alkyl amines. Tertiaiary alkyl amine such as triethyl amine, trioctyl amine, triethanol amine or triisopropanol amine can interact with sulfonimide-type PAGs during resist storage. Such PAG-quencher interaction can decrease resist development constrast and sensitivity over time.

Examples of the second quencher include, but are not limited to, N,N-Diethyldodecanamide, 2,8-Dimethyl-6H, 12H-5,11-methanodibenzo[b,f][1,5]diazocine (Troger's Base),1,1-Dimethylethyl 4-hydroxypiperidine-1-carboxylate and N-Allylcaprolactam.

The amount of the second quencher in the radiation-sensitive film is preferably from 0.001 to 1.0 wt %, more preferably from 0.01 to 0.5 wt % or from 0.02 to 0.2 wt % based on the weight of the resin (a).

(e) Solvent

The composition comprises at least one solvent. Examples of the solvent include, but are not limited to, propylene glycol methyl ether acetate (PGMEA), propylene glycol 1-methyl ether (PGME), ethyl lactate (EL), 2-hydroxyisobutyric acid methyl ester (HBM), gamma-butyrolactone (GBL), 3-methoxypropanoic acid methyl ester, 2-heptanone, 2,6-dimethyl-4-heptanone and anisole preferably, PGMEA, 3-methoxypropanoic acid methyl ester, 2-heptanone, 2,6-dimethyl-4-heptanone, anisole and combinations thereof. The content of the solvent in the composition is typically from 40 to 90 wt %, preferably from 50 to 70 wt %, based on the total composition.

(f) Optional Components

The radiation-sensitive composition can comprise other optional ingredients, such as one or more surface leveling agent (SLA), adhesion promoter and/or plasticizer. If used, the SLA is preferably present in an amount of from 0.001 to 0.1 wt % based on total solids of the composition, and the adhesion promoter and/or plasticizer each in an amount of from 0.1 to 10 wt % based on total solids of the composition.

Processes in accordance with the invention which make use of the radiation-sensitive compositions will now be described. In accordance with a patterning process of the invention, a radiation-sensitive film is formed on a substrate from a radiation-sensitive composition as described herein. The composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning.

The radiation-sensitive film can next be softbaked to minimize the solvent content in the film, thereby forming a tack-free coating and improving adhesion of the film to the substrate. The softbake can be conducted on a hotplate or in an oven, with a hotplate being typical.

The radiation-sensitive film is then patternwise exposed to activating radiation through a photomask to create a difference in solubility between exposed and unexposed regions. References herein to exposing a radiation-sensitive film to radiation that is activating for the film indicates that the radiation is capable of forming a latent image in the film. The photomask has optically transparent and optically opaque regions corresponding to regions of the resist layer to be exposed and unexposed, respectively, by the activating radiation. The exposure wavelength is typically sub-500 nm, such as from 200 to 500 nm or visible light. Preferably, the exposure is conducted with radiation of 365 nm wavelength (i-line).

Following exposure of the radiation-sensitive film, a post exposure bake (PEB) is typically performed to remove solvent from the film. The PEB can be conducted, for example, on a hotplate or in an oven. A latent image defined by the boundary between polarity-switched and unswitched regions (corresponding to exposed and unexposed regions, respectively) is thereby formed.

The radiation-sensitive film is next contacted with an alkaline developing solution to remove exposed portions of the film, leaving unexposed regions forming a resist pattern. The developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH).

A further aspect of the invention is a process for depositing a metal on a metal layer. The process includes: (i) forming a radiation-sensitive film on a metal layer; (ii) patternwise exposing the radiation-sensitive film to activating radiation; and (iii) contacting the radiation-sensitive film with an alkaline developing solution to remove exposed portions of the radiation-sensitive film; and (iv) immersing the metal layer in a metal plating solution and depositing a metal on the metal layer in the exposed portions of the radiation-sensitive film. Between the steps (ii) and (iii), a post exposure baking step is typically conducted. The metal layer is typically formed on a substrate.

The metal layer can be made, for example, of copper, silver, aluminum, gold or an alloy thereof. The metal layer may also be referred to herein as the first metal layer. When the metal layer is formed on a substrate, the metal layer can be formed using known methods, for example, by chemical vapor deposition (CVD) or physical vapor deposition (PVD) techniques, with sputtering and plating being typical. The thickness of the metal layer is typically from 10 nm to 1000 nm. Examples of the substrate include, but are not limited to, silicon wafers, glass substrates and plastic substrates, such substrates optionally including one or more layers or features formed thereon.

The radiation-sensitive film is formed from a composition as described herein, comprising: (a) a resin, (b) a photoacid generator, (c) a first quencher, (d) a second quencher and (e) a solvent. The composition is applied on the metal layer by a known method, such as spin-coating, roll coating or screen printing. To form a thick radiation-sensitive film, a high solid content and/or high viscosity of the composition is typically desired. The solid content of the composition is typically from 10 to 60 wt %, preferably from 30 to 50 wt %, based on the total composition. By using such a composition, a thick layer, for example, of 20 microns or greater, preferably from 20 to 120 microns, can be formed.

After applying the composition, soft baking can be conducted to minimize the solvent content in the layer and improving adhesion of the layer to the substrate. The radiation-sensitive film is then exposed through a mask having a predefined pattern using radiation such as ultraviolet light having a wavelength of from 200 to 500 nanometers (nm) or visible light. Preferably, the exposure is conducted with radiation of 365 nm wavelength (i-line).

The radiation-sensitive film is contacted with an alkaline developing solution to develop the exposed portions of the radiation-sensitive film. Examples of the alkaline developing solution include, but are not limited to, aqueous solutions of tetramethyl ammonium hydroxide, sodium hydroxide and potassium hydroxide. The exposed portions can form a pattern such as a hole (e.g., contact, via or bump pattern) or trench (e.g., line-space) pattern. Such patterns preferably have a high aspect ratio. As used herein, aspect ratio (AR) is defined as AR=h/d, wherein h is the photoresist height (i.e., thickness) and d is the spacing in the pattern, for example, hole diameter (e.g., for contact, via or bump patterns) or length of space between adjacent lines (e.g., for trench patterns). Typically, the hole diameter can be from 5 to 200 microns, preferably from 10 to 50 microns. The aspect ratio is typically 0.1 or more, 0.5 or more, from 0.1 to 10.0, or from 0.5 to 7.0.

The substrate can next be immersed in a metal plating solution to plate metal on the exposed first metal layer in those regions in which the radiation-sensitive film has been developed away. The developed regions of the radiation-sensitive film function as a mold for the metal plating. The metal can be plated, for example, by electroless plating or electroplating. Various types of metal plating solutions known in the art can be used for the invention. Also, two or more different layers of metal can be formed, and the layers can be of the same or different metals. Preferable plated metals include, but are not limited to, copper, nickel, tin, silver, gold and mixtures and alloys thereof. Suitable metal plating solutions for use in forming such metals are known in the art and are commercially available from Dow Electronic Materials. The thickness of the plated metal layer is typically from 10 to 100 microns, preferably from 20 to 50 microns. The plated metal layer thickness can be less than or exceed the thickness of the photoresist layer.

After metal plating, the remaining radiation-sensitive film can be removed (stripped) from the substrate. Suitable photoresist strippers are commercially available, for example, Shipley BPR™ Photostripper (Dow Electronic Materials).

The exposed first metal layer between the plated metal structures can be removed, for example, by etch-back process, to electrically isolate each of the plated metal structures. The obtained metal structures can have, for example, a pillar shape, which can be useful for a metal bump for providing electrical connection between two components. Advantageously, metal pillars having small-diameter and straight (vertical) sidewalls can be formed by compositions and methods of the invention. Such structures find use, for example, in electrical connections in small, light and thin devices. The width (diameter) of the pillars can, for example, be from 5 to 200 microns, preferably from 10 to 50 microns. The height of the pillars will depend, for example, on the thickness of the radiation-sensitive resin, but pillar heights of 20 microns or more can be formed.

EXAMPLES

The following non-limiting examples are illustrative of the invention. In the tables below, the following terms have the indicated meanings: pbw=parts by weight; PAG=photoacid generator; SLA=surface leveling agent; $E_{th}$=bulk sensitivity (the minimum exposure dose at which film thickness loss was observed); Mw=weight average molecular weight (GPC with Styrene polymer standard); "PF-656"=PolyFox™PF-656 (OMNOVA Solutions Inc.); PGMEA=propylene glycol methyl ether acetate; GBL=gamma-butyrolactone; CH=contact holes; SB=softbake; Observed energy=exposure energy of the pattern profile observed; and Top diameter=measured contact hole diameter at the top of the contact hole.

(A) Comparison of Photoacid Generators:

Examples 1 to 4

To select a suitable photoacid generator, the following test was conducted. Photosensitive compositions were prepared using the components and amounts shown in Table 1. Three kinds of photoacid generators were used, i.e. Irgacure PAG 103 (2-(propylsulfonyloxyimino)-2,3-dihydrothiophen-3-ylidene)-(o-tolyl)acetonitriile (BASF), NIT (N-Hydroxynaphthalimide trifluoromethanesulfonate (Heraeus) and NIN (N-Hydroxynaphthalimide perfluoro-1-butanesulfonate (Heraeus). The compositions were spin-coated on silicon wafers previously sputter-coated with a copper layer. Spin speed was adjusted to obtain a 50 micron film after soft-bake process. The wafers were soft-baked at 135° C. for 6 minutes to obtain resist films. The resist films were then exposed using a broad band proximity exposure tool (MA-1200, Japan Science Engineering Co., Ltd.) with multi-tone photomask. After the exposure process, the wafers were baked at 90° C. for 3 minutes, followed by development in MF CD-26 TMAH developer (Dow Electronic Materials) using a one (1) minute puddle sequence four times in succession. The resist profiles were evaluated using cross-sectional SEM images.

TABLE 1

| Samples | | Ex 1 | Ex 2 | Ex 3 | Ex 4 |
|---|---|---|---|---|---|
| Polymer (pbw) | Polymer A | 100 | 100 | 100 | 100 |
| PAG (pbw) | NIN | — | — | — | 0.79 |
| | NIT | | | | 0.21 |
| | PAG-103 | 1.0 | 1.0 | 1.0 | |

TABLE 1-continued

Figure 1:
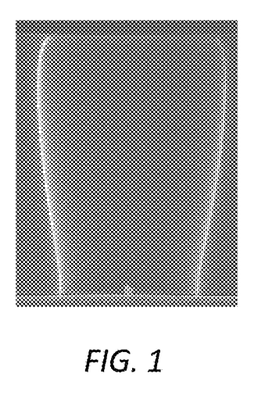
FIGS. 1-8 and 10-26 are cross-sectional SEM images of contact hole resist patterns from the examples.
Figure 2:
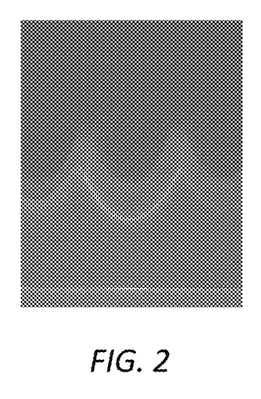
Figure 3:
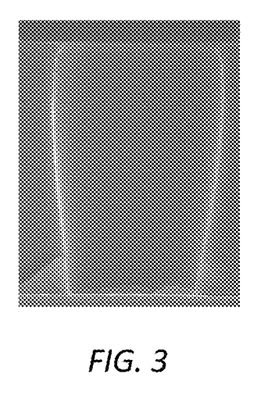
Figure 4:
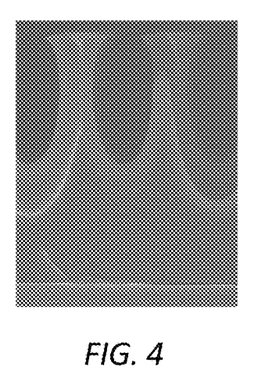
Figure 5:
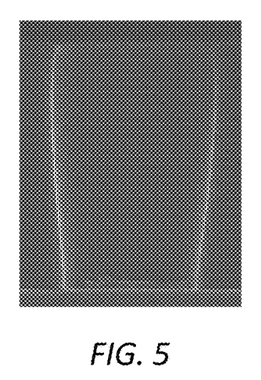
Figure 6:
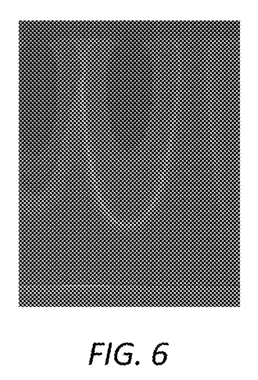
Figure 7:
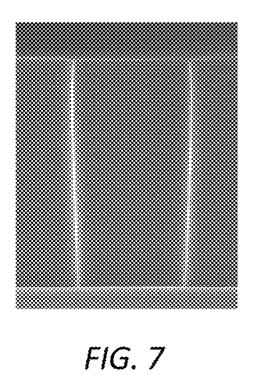
Figure 8:
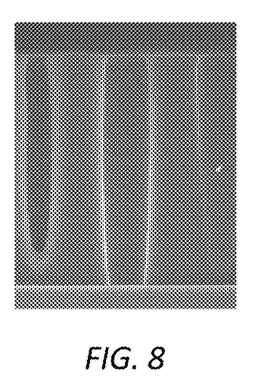
Figure 9:
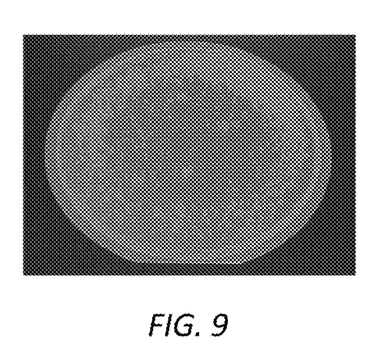
FIG. 9 is a photo-image of a wafer from the examples.

| Samples | | Ex 1 | Ex 2 | Ex 3 | Ex 4 |
|---|---|---|---|---|---|
| Quencher (pbw) | Troger's Base | 0.018 | 0.036 | 0.108 | 0.185 |
| Plasticizer (pbw) | LUTONAL M40 | 5.0 | 5.0 | 5.0 | 4.0 |
| SLA (pbw) | PF-656 | 0.05 | 0.05 | 0.05 | 0.05 |
| Solvent (pbw) | PGMEA/GBL | 115/6 | 115/6 | 115/6 | 115/6 |
| $E_{th}$ (mJ/cm$^2$) | On Silicon | 125 | 150 | 240 | 240 |
| Pattern Profile on Silicon | 25 μm 1:1 CH | FIG. 1 | FIG. 3 | FIG. 5 | FIG. 7 |
| | 10 μm 1:1 CH | FIG. 2 | FIG. 4 | FIG. 6 | FIG. 8 |
| | Exposure Energy (mJ/cm$^2$) | 120 | 150 | 240 | 280 |
| Popping issue on Copper | After SB process | Popping FIG. 9 | Not tested | Not tested | No Popping |

The chemical structures for other ingredients used in Examples are as follows:

NIT

NIN

PAG-103

Troger's Base     LUTONAL M40

PHS      TBA
65mol%   35mol%

Polymer A (Mw = 20,000 Da)

PHS 10mol% / MHS 60mol% / TBA 20mol%
Polymer B (Mw = 20,000 Da)

PHS 70mol% / STY 10mol% / ECPMA 20mol%
Polymer C (Mw = 13,000 Da)

The samples using Irgacure PAG 103 resulted in a tapered profile (see FIGS. 1-6), while those using NIN and NIT exhibited a rectangular shape (see FIGS. 7-8). Example 1 resulted in a severe popping problem on copper surface after soft-bake (see FIG. 9), while there was no such issue found on a silicon surface. In Example 4, there was no popping problem for both copper and silicon surfaces.

(B) Comparison of Azole Compounds (First Quencher):

Examples 5 to 7

The following test was conducted to investigate the suitability of azole compounds as the first quencher. Photosensitive compositions were prepared using the components and amounts shown in Table 2. Three types of azole compounds (benzotriazole, vinyl imidazole and benzimidazole) were compared. The amounts of the azole compounds were adjusted for similar sensitivity with the same formulation other than the azole compounds. The compositions were mixed and spin-coated on silicon wafers and copper-coated silicon wafers, and were processed in the same manner described in Example 1. Cross-sectional SEM images were used to evaluate the resulting structures.

TABLE 2

Figure 10:
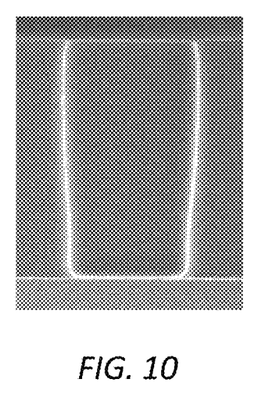
Figure 11:
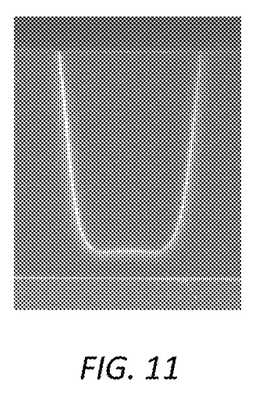
Figure 12:
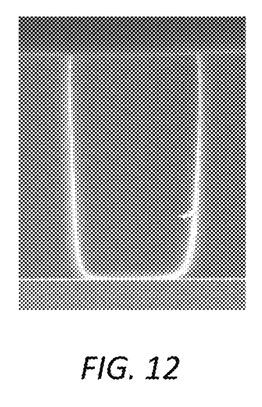

| | Samples | Ex 5 | Ex 6 | Ex 7 |
|---|---|---|---|---|
| Polymer (pbw) | Polymer A | 100 | 100 | 100 |
| PAG (pbw) | NIN | 0.55 | 0.55 | 0.55 |
| | NIT | 0.45 | 0.45 | 0.45 |
| Azole compounds | Compounds | BenzoTriazole | Vinylimidazole | Benzimidazole |
| | loading (wt %) | 0.065 | 0.103 | 0.039 |
| Plasticizer (pbw) | LUTONAL M40 | 4.0 | 4.0 | 4.0 |
| SLA (pbw) | PF-656 | 0.05 | 0.05 | 0.08 |
| Solvent (pbw) | PGMEA/GBL | 115/6 | 115/6 | 115/6 |
| Eth (mJ/cm$^2$) | On Si | 100 | 120 | 90 |
| | On Cu | 90 | >200 | 130 |
| Pattern Profile | 1:1 25 μm CH | FIG. 10 | FIG. 11 | FIG. 12 |
| On Cu | Observed energy (mJ/cm$^2$) | 90 | 200 | 130 |

The bulk sensitivity ($E_{th}$) of Example 5 on copper surface was faster than the $E_{th}$ on silicon. Examples 6 and 7 resulted in a slower $E_{th}$ on copper surface as compared with silicon. In addition, the profile shown in FIG. 10 from Example 5 is improved as compared with those of FIGS. 11 (Example 6) and 12 (Example 7). These results are believed to indicate that benzotriazole prevented photoacid consumption at the copper surface.

(C) Effect of Second Quencher:

Examples 8 to 10

Photosensitive compositions were prepared using the components and amounts shown in Table 3. The compositions were mixed and spin-coated on silicon wafers and copper-coated silicon wafers, and were processed in the same manner described in Example 1. Cross-sectional SEM images were used to evaluate the resulting structures.

TABLE 3

Figure 13:
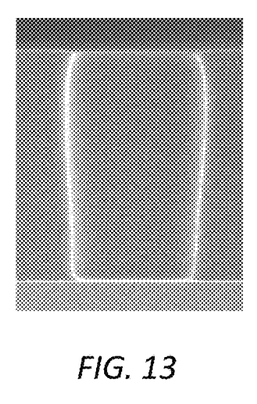
Figure 14:
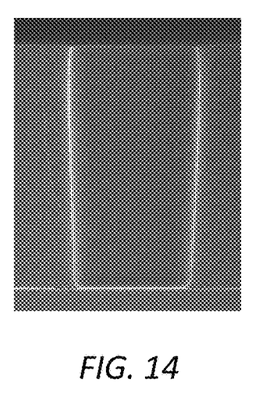
Figure 15:
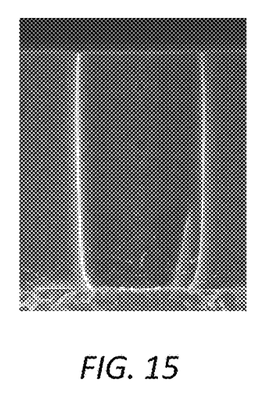

| | | Ex. 8 | Ex. 5 | Ex. 9 | Ex. 10 |
|---|---|---|---|---|---|
| Polymer (pbw) | Polymer A | 100 | 100 | 100 | 100 |
| PAG (pbw) | NIN | 0.55 | 0.55 | 0.79 | 0.79 |
| | NIT | 0.45 | 0.45 | 0.21 | 0.21 |
| Quencher (pbw) | Benzotriazole | 0.200 | 0.065 | 0.022 | — |
| | Troger's base | — | — | 0.046 | 0.185 |
| Plasticizer (pbw) | LUTONAL M40 | 4.0 | 4.0 | 4.0 | 4.0 |
| SLA (pbw) | PF-656 | 0.05 | 0.05 | 0.05 | 0.05 |
| Solvent (pbw) | PGMEA/GBL | 115/6 | 115/6 | 115/6 | 115/6 |
| Eth (mJ/cm$^2$) | On Si | 390 | 100 | 75 | 240 |
| | On Cu | 390 | 90 | 75 | 280 |
| Pattern Profile | 1:1 25 μm CH On Cu | FIG. 13 | FIG. 10 | FIG. 14 | FIG. 15 |
| | Observed energy (mJ/cm$^2$) | 390 | 90 | 90 | 320 |

Examples 5 and 8 containing benzotriazole exhibited the same or slightly faster $E_{th}$ on copper as compared with $E_{th}$ on silicon. These results are believed to indicate that benzotriazole prevented photoacid consumption at the copper surface. The pattern formed in Example 8 (FIG. 13) showed no footing but resulted in a capping profile (overhang at top of the contact hole). In comparison, the photosensitive composition of Example 9 (FIG. 14) resulted in a straight sidewall angle with no footing or capping profile. This result is believed to indicate that the capping profile can be avoided by inclusion of the second quencher.

(D) Examples for Various Loading Amounts of 1$^{st}$ and 2$^{nd}$ Quenchers:

Examples 11 to 14

Photosensitive compositions were prepared using the components and amounts shown in Table 4. Examples 11-14 contain the same amount of benzotriazole (first quencher) while the amount of second quencher (Troger's base) was varied. Cross-sectional SEM images were used to evaluate the resulting structures. The pattern size (diameter of contact hole patterns) was measured by optical microscope (Lasertec H300M) images.

TABLE 4

Figure 16:
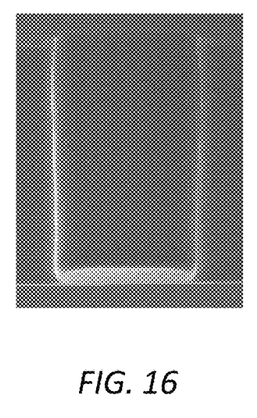
Figure 17:
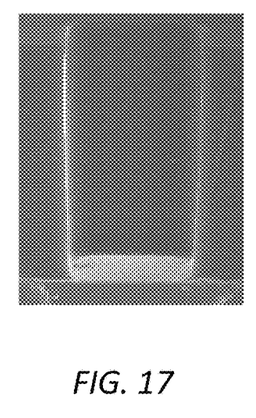
Figure 18:
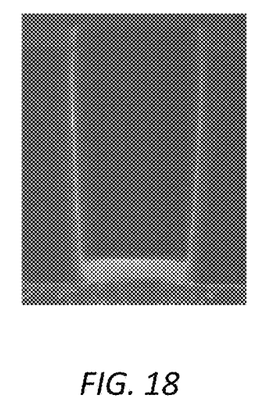
Figure 19:
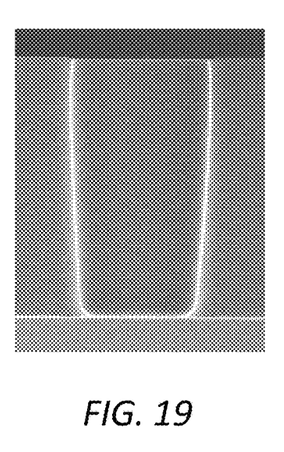

|  |  | Ex. 11 | Ex. 12 | Ex. 13 | Ex. 14 |
|---|---|---|---|---|---|
| Polymer (pbw) | Polymer A | 100 | 100 | 100 | 100 |
| PAG (pbw) | NIN | 0.79 | 0.79 | 0.79 | 0.79 |
|  | NIT | 0.21 | 0.21 | 0.21 | 0.21 |
| Quencher (pbw) | Benzotriazole | 0.022 | 0.022 | 0.022 | 0.022 |
|  | Troger's base | — | 0.015 | 0.031 | 0.046 |
| Plasticizer (pbw) | LUTONAL M40 | 4.0 | 4.0 | 4.0 | 4.0 |
| SLA (pbw) | PF-656 | 0.05 | 0.05 | 0.05 | 0.05 |
| Solvent (pbw) | PGMEA/GBL | 115/6 | 115/6 | 115/6 | 115/6 |
| Eth (mJ/cm$^2$) | On Si | 40 | 50 | 60 | 80 |
|  | On Cu | 40 | 50 | 60 | 80 |
| Pattern Profile on Cu | 1:1 25 μm CH | FIG. 16 | FIG. 17 | FIG. 18 | FIG. 19 |
|  | Observed energy (mJ/cm$^2$) | 40 | 50 | 60 | 80 |
|  | Top diameter (μm) | 27.7 | 26.0 | 25.2 | 24.6 |

There was no difference in bulk sensitivity ($E_{th}$) for the silicon and copper surfaces for any of the samples. Sensitivity was found to increase with a decrease in second quencher amount. Resulting pattern size was compared at the bulk sensitivity ($E_{th}$) of each sample. It was observed that reducing the amount of the second quencher resulted in increased pattern size at $E_{th}$. Based on these results, it is believed that pattern size can be controlled by adjusting the content of the second quencher, and that an improvement in exposure latitude occurs with an increase in the second quencher amount.

(E) Examples for Derivatives of Benzotriazole (1$^{st}$ Quencher):

Examples 15 to 17

Photosensitive compositions were prepared using the components and amounts shown in Table 5. Three kinds of benzotriazole derivatives, i.e., 1H-benzotiazole-1-methanol, 5-methyl-1H-benzotriazole and 5,6-dimethyl-1,2,3-benzotriazole hydrate, were used. The compositions were mixed and spin-coated on silicon wafers and copper-coated silicon wafers, and were processed in the same manner described in Example 1. Cross-sectional SEM images were used to evaluate the resulting structures. The pattern size (diameter of contact hole patterns) was measured by optical microscope (Lasertec H300M) images.

TABLE 5

Figure 20:
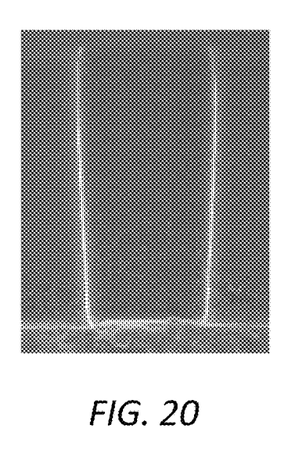
Figure 21:
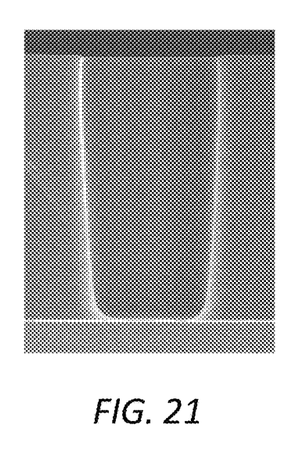
Figure 22:
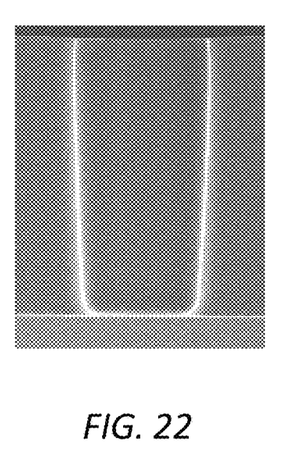

|  |  | Ex. 15 | Ex. 16 | Ex. 17 |
|---|---|---|---|---|
| Polymer (pbw) | Polymer A | 100 | 100 | 100 |
| PAG (pbw) | NIN | 0.448 | 0.448 | 0.448 |
|  | NIT | 0.552 | 0.552 | 0.552 |
| Quencher (pbw) | 1H-benzotriazole-1-methanol | 0.0232 | — | — |
|  | 5-methyl-1H-benzotriazole | — | 0.0259 | — |
|  | 5,6-dimethyl-1,2,3-benzotriazole hydrate | — | — | 0.0322 |
|  | Troger's base | 0.0488 | 0.0488 | 0.0488 |
| Plasticizer (pbw) | LUTONAL M40 | 4.0 | 4.0 | 4.0 |
| SLA (pbw) | PF-656 | 0.05 | 0.05 | 0.05 |
| Solvent (pbw) | PGMEA/GBL | 115/6 | 115/6 | 115/6 |
| Eth (mJ/cm$^2$) | On Si | 80 | 80 | 80 |
|  | On Cu | 80 | 90 | 100 |
| Pattern Profile on Cu | 1:1 25 μm CH | FIG. 20 | FIG. 21 | FIG. 22 |
|  | Observed energy (mJ/cm$^2$) | 80 | 100 | 100 |
|  | Top diameter (μm) | 24.7 | 25.1 | 24.7 |

The data indicates that the tested benzotriazole derivatives are suitable for use in the compositions and methods of the present invention.

(F) Examples for Various Resins:

Examples 18 to 21

Photosensitive compositions were prepared using the components and amounts shown in Table 6. Polyethylene glycol monomethyl ether (Mw=400) was used as plasticizer. The compositions were mixed and spin-coated on silicon wafers and copper-coated silicon wafers, and were processed in the same manner described in Example 1.

TABLE 6

Figure 23:
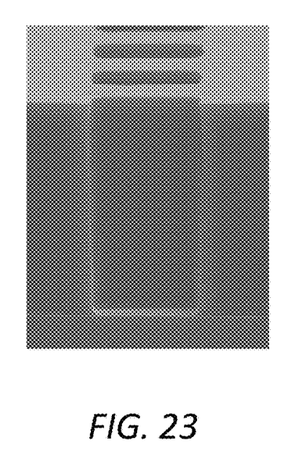
Figure 24:
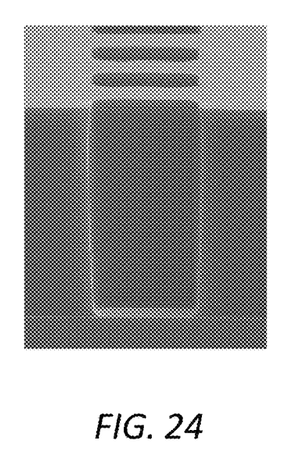
Figure 25:
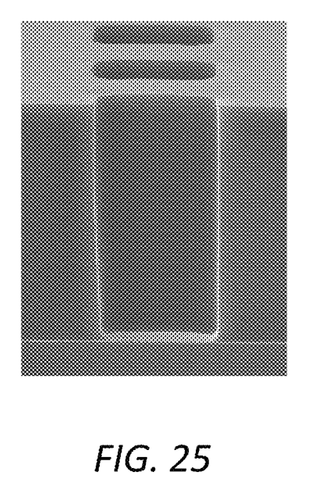
Figure 26:
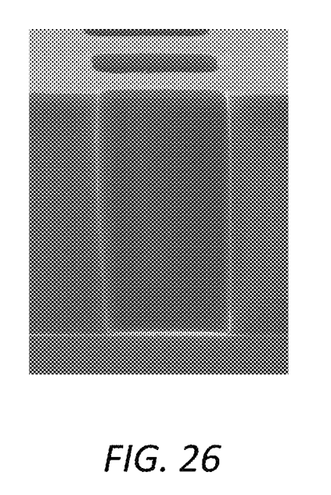

|  |  | Ex. 18 | Ex. 19 | Ex. 20 | Ex. 21 |
|---|---|---|---|---|---|
| Polymer (pbw) | Polymer A | 50 | 30 |  |  |
|  | Polymer B | 50 | 70 |  |  |
|  | Polymer C |  |  | 50 | 30 |
|  |  |  |  | 50 | 70 |
| PAG (pbw) | NIN | 0.79 | 0.79 | 0.79 | 0.79 |
|  | NIT | 0.21 | 0.21 | 0.21 | 0.21 |
| Quencher (pbw) | Benzotriazole | 0.022 | 0.022 | 0.022 | 0.022 |
|  | Troger's base | 0.046 | 0.046 | 0.046 | 0.046 |
| Plasticizer (pbw) | Polyethyleneglycol monomethyl ether Mw = 400 | 1.0 | 1.0 | 1.0 | 1.0 |
| SLA (pbw) | PF-656 | 0.05 | 0.05 | 0.05 | 0.05 |
| Solvent (pbw) | PGMEA/GBL | 115/6 | 115/6 | 115/6 | 115/6 |
| Eth (mJ/cm$^2$) | On Si | 100 | 110 | 80 | 90 |
|  | On Cu | 90 | 120 | 80 | 90 |
| Pattern Profile | 1:1 25 μm CH On Cu | FIG. 23 | FIG. 24 | FIG. 25 | FIG. 26 |
|  | Observed energy (mJ/cm$^2$) | 180 | 195 | 150 | 170 |

(G) Copper Pillar Formation:

Example 22

Figure 27:
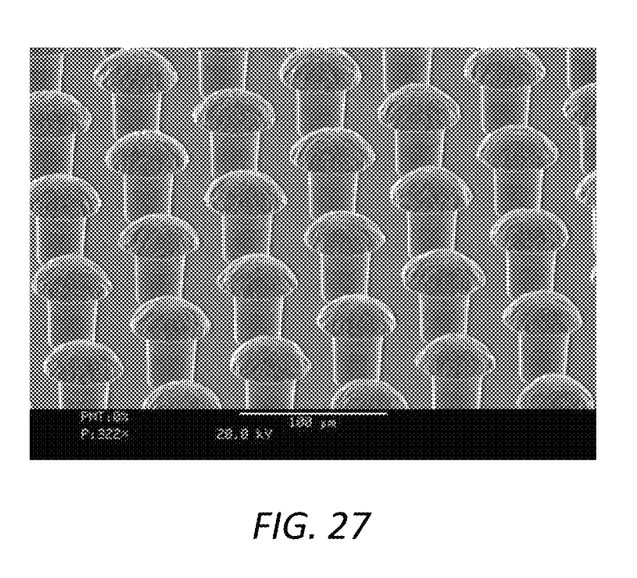
FIG. 27 is an SEM image of a pillar array after resist removal from the examples.

The composition of Example 9 was spin-coated on a silicon wafer previously sputter-coated with a copper layer. Spin speed was adjusted to obtain a 50 micron film after soft-bake process. The wafer was soft-baked at 135° C. for 6 minutes to obtain a resist film. The resist film was exposed using a broad band proximity exposure tool (MA-200CC, Karl Suss) with a photomask having a 25 micron diameter/75 micron pitch contact hole array pattern. The wafer was then baked at 90° C. for 3 minutes, followed by development in MF™CD-26 TMAH developer (Dow Electronic Materials) using a one (1) minute puddle sequence four times in succession. After resist pattern preparation, a first electroplating process was conducted using INTERVIA™ Cu 8540 electroplating solution (Rohm and Haas Electronic Materials) at a bath temperature of 25° C. for 12.5 minutes, to form copper pillars having a diameter of 25 microns, a height of 25 microns and a pitch of 75 microns. A second electroplating step was conducted using NIKAL™ BP RTU electroplating solution (Dow Electronic Materials) at a bath temperature of 50° C. for 3 minutes, to form a 3 micron thick nickel layer stacked on the copper pillar. A third electroplating step was conducted using SOLDERON™ BP TS 6000 electroplating solution (Dow Electronic Materials) at a bath temperature of 25° C. for 4 minutes, to form a 20 micron tin-silver layer stacked on the nickel/copper pillars. The resist layer was next removed using Shipley BPR™ Photostripper (Dow Electronic Materials) at a bath temperature of 90° C. by soaking for 5 minutes. The pillar array was observed by SEM and is shown in FIG. 27. The pillars exhibited smooth and straight sidewalls. The photoresist showed good chemical resistance and thermal resistance to the electroplating processes without the formation of cracks or voids. A clean surface was also observed between pillars, indicating that the resist was able to be completely removed.

What is claimed is:

1. A patterning process, comprising:
   (i) forming a radiation-sensitive film on a substrate, wherein the radiation-sensitive film comprises: (a) a resin, (b) a photoacid generator, (c) a first quencher, and (d) a second quencher;
   (ii) patternwise exposing the radiation-sensitive film to activating radiation; and
   (iii) contacting the radiation-sensitive film with an alkaline developing solution to form a resist pattern;
   wherein the resin comprises the following repeat units:

wherein: $R_1$ is selected from a hydrogen atom, an alkyl group having from 1 to 4 carbon atoms, a cyano group or a trifluoromethyl group; Z is a non-hydrogen substituent that provides an acid-labile moiety; n is from 40 to 90 mol %; m is from 10 to 60 mol %; and the total combined content of the two repeat units in the resin is 80 mol % or more based on all repeat units of the resin;
   the first quencher is selected from benzotriazole or a derivative thereof; and
   the second quencher is selected from N,N-diethyldodecanamide, 2,8-dimethyl-6H,12H-5,11-methanodibenzo[b,f][1,5]diazocine, 1,1-dimethylethyl 4-hydroxypiperidine-1-carboxylate and N-allylcaprolactam.

2. The process of claim 1, wherein the activating radiation has a wavelength of 365 nm.

3. The patterning process of claim 1, further comprising depositing a metal on the substrate in regions defined by the resist pattern.

4. A process for depositing a metal on a metal layer, comprising the steps of:
   (i) forming a radiation-sensitive film on a metal layer, wherein the film comprises: (a) a resin, (b) a photoacid generator, (c) a first quencher, and (d) a second quencher;
   (ii) patternwise exposing the radiation-sensitive film to activating radiation; and
   (iii) contacting the radiation-sensitive film with an alkaline developing solution to remove exposed portions of the radiation-sensitive film; and
   (iv) immersing the metal layer in a metal plating solution and depositing a metal on the metal layer in the exposed portions of the radiation-sensitive film;
   wherein the resin comprises the following two repeat units:

wherein: $R_1$ is selected from a hydrogen atom, an alkyl group having from 1 to 4 carbon atoms, a cyano group or a trifluoromethyl group; Z is a non-hydrogen substituent that provides an acid-labile moiety; n is from 40 to 90 mol %; m is from 10 to 60 mol %; and the total combined content of the two repeat units in the resin is 80 mol % or more based on all repeat units of the resin;
   the first quencher is selected from benzotriazole or a derivative thereof; and
   the second quencher is selected from N,N-diethyldodecanamide, 2,8-dimethyl-6H,12H-5,11-methanodibenzo[b,f][1,5]diazocine, 1,1-dimethylethyl 4-hydroxypiperidine-1-carboxylate and N-allylcaprolactam.

5. The process of claim 4, wherein the resin has a weight average molecular weight of from 10,000 to 30,000 Daltons.

6. The process of claim 4, wherein the photoacid generator of the radiation-sensitive film is selected from one or more of N-hydroxynaphthalimide trifluoromethanesulfonate, N-hydroxynaphthalimide perfluoro-1-butanesulfonate, N-hydroxynaphthalimide camphor-10-sulfonate, N-hydroxynaphthalimide 2-trifluoromethylphenylsulfonate, N-hydroxy-5-norbornene-2,3-dicarboximide perfluoro-1- butanesulfonate, N-(trifluoromethylsulfonyloxy)phthalimide and N-hydroxysuccinimide perfluorobutanesulfonate.

7. The process of claim 4, wherein the amount of the first quencher is from 0.001 to 1.0 wt % based on the weight of the resin.

8. The process of claim 4, wherein the amount of the second quencher is from 0.001 to 1.0 wt % based on the weight of the resin.

9. The process of claim 4, wherein the metal deposition is in the form of a pillar having a diameter of 200 microns or less and a height of 20 micron or more.

10. The process of claim 4, wherein the metal layer comprises copper.

11. The process of claim 4, wherein the activating radiation has a wavelength of 365 nm.

* * * * *